United States Patent
White et al.

(10) Patent No.: US 8,247,328 B2
(45) Date of Patent: Aug. 21, 2012

(54) POLISHING SILICON CARBIDE

(75) Inventors: Michael White, Oswego, IL (US); Lamon Jones, Aurora, IL (US); Jeffrey Gilliland, Montgomery, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 678 days.

(21) Appl. No.: 12/387,506

(22) Filed: May 4, 2009

(65) Prior Publication Data

US 2010/0279506 A1 Nov. 4, 2010

(51) Int. Cl.
*H01L 21/302* (2006.01)
*B44C 1/22* (2006.01)

(52) U.S. Cl. ............ 438/693; 438/692; 216/88; 216/89

(58) Field of Classification Search .................. 438/692, 438/693; 216/88, 89
See application file for complete search history.

(56) References Cited

U.S. PATENT DOCUMENTS

| | | | | |
|---|---|---|---|---|
| 7,651,625 B2* | 1/2010 | Yamauchi et al. | ............... | 216/83 |
| 7,776,228 B2* | 8/2010 | Yamauchi et al. | ............... | 216/83 |
| 7,998,866 B2* | 8/2011 | White et al. | ................... | 438/690 |
| 2003/0139069 A1* | 7/2003 | Block et al. | ................... | 438/962 |
| 2008/0057713 A1* | 3/2008 | Desai et al. | ................... | 438/691 |
| 2008/0153292 A1* | 6/2008 | White et al. | ................... | 438/692 |
| 2008/0305718 A1* | 12/2008 | Kawata et al. | ................... | 451/36 |

FOREIGN PATENT DOCUMENTS

JP 2004-327952 * 11/2004

* cited by examiner

*Primary Examiner* — Shamim Ahmed
(74) *Attorney, Agent, or Firm* — Thomas E. Omholt; Susan Steele; Steven D. Weseman

(57) ABSTRACT

The invention provides a method of chemically-mechanically polishing a substrate comprising at least one layer of single crystal silicon carbide. The method utilizes a chemical-mechanical polishing composition comprising a liquid carrier, an abrasive, a catalyst comprising a transition metal composition, and an oxidizing agent.

21 Claims, No Drawings

POLISHING SILICON CARBIDE

BACKGROUND OF THE INVENTION

Semiconductors with the ability to operate more efficiently in order to achieve a significant reduction in power consumption are highly desirable. Typically, silicon substrates are used in the manufacture of such devices; however, further development is limited due to the inherent characteristics of silicon. Development of the next generation of semiconductor devices has emphasized the use of materials having a greater hardness and other unique properties. For example, silicon carbide, when compared with silicon oxide, has a higher thermal conductivity, a greater tolerance for radiation, and a higher dielectric strength, and is able to withstand greater temperatures, which makes it suitable for a variety of applications. The use of silicon carbide has been limited to some extent by semiconductor fabrication technology.

In order to produce silicon carbide semiconductors, the surfaces of the silicon carbide substrates must be polished in order to provide smooth surfaces and to obtain precise dimensions for the surfaces. The properties which make silicon carbide such a useful substrate provide unique challenges in the polishing process. Due to the hardness of silicon carbide, diamond grit is typically used to mechanically polish silicon carbide substrates.

Chemical-mechanical polishing (CMP) techniques are widely used throughout the semiconductor industry in order to polish the current generation of silicon devices. CMP involves the use of a polishing composition (also known as a polishing slurry) containing an abrasive and an aqueous material, which is applied to a surface by contacting the surface with a polishing pad saturated with the polishing composition. The polishing composition may also contain an oxidizing agent, which allows for less aggressive mechanical abrasion of the substrate, thus reducing mechanical damage to the substrate caused by the abrading process. The use of such techniques to polish silicon carbide substrates could greatly reduce the costs of manufacturing semiconductors by decreasing polish time and reducing damage to the substrate.

Adaptation of CMP techniques for silicon carbide polishing has been relatively unsuccessful. Polishing compositions containing colloidal silica resulted in low silicon carbide removal rates, thus requiring a lengthy polishing cycle lasting several hours at temperatures of around 50° C., which is likely to result in damage to the silicon carbide substrate. Zhou, et al., *J. Electrochemical Soc.*, 144: L161-L163 (1997); Neslen, et al., *J. Electronic Materials*, 30: 1271-1275 (2001). The long polishing cycle adds considerable cost to the process and is a barrier preventing widespread use of silicon carbide within the semiconductor industry. Thus, there remains a need for alternative polishing systems and methods of polishing substrates comprising silicon carbide.

BRIEF SUMMARY OF THE INVENTION

The invention provides a method of chemically-mechanically polishing a substrate comprising (i) providing a substrate comprising at least one layer of single crystal silicon carbide, (ii) contacting the substrate with a chemical-mechanical polishing composition comprising (a) a liquid carrier, (b) an abrasive, (c) a catalyst comprising a metal composition, wherein the metal is selected from the group consisting of transition metals, and (d) an oxidizing agent that oxidizes silicon carbide, (iii) moving the composition relative to the substrate, and (iv) abrading at least a portion of the silicon carbide of the substrate to polish the substrate.

DETAILED DESCRIPTION OF THE INVENTION

The invention is directed to a method of polishing a substrate containing at least one layer of single crystal silicon carbide. The substrate comprising at least one layer of single crystal silicon carbide is contacted with a chemical-mechanical polishing composition. The chemical-mechanical polishing composition comprises, consists essentially of, or consists of (a) a liquid carrier, (b) an abrasive, (c) a catalyst comprising a metal composition, wherein the metal is selected from the group consisting of transition metals, and (d) an oxidizing agent that oxidizes silicon carbide. At least a portion of the silicon carbide then is abraded to polish the substrate.

The substrate to be polished using the method of the invention can be any suitable substrate which comprises at least one layer of silicon carbide. Suitable substrates include, but are not limited to, flat panel displays, integrated circuits, memory or rigid disks, metals, interlayer dielectric (ILD) devices, semiconductors, micro-electro-mechanical systems, ferroelectrics, and magnetic heads. The silicon carbide can comprise, consist essentially of, or consist of any suitable silicon carbide, many of which are known in the art. The silicon carbide can be single crystal. Silicon carbide has many different types of crystal structures, each having its own distinct set of electronic properties. Only a small number of these polytypes, however, can be reproduced in a form acceptable for use as semiconductors. Such polytypes can be either cubic (e.g., 3C silicon carbide) or non-cubic (e.g., 4H silicon carbide, 6H silicon carbide). The properties of these polytypes are well known in the art.

The abrasive can be any suitable abrasive, many of which are well known in the art. The abrasive can comprise, consist essentially of, or consist of one or more metal oxides. The metal oxide can be selected from the group consisting of alumina, ceria, germania, magnesia, silica, titania, zirconia, co-formed products thereof, and combinations thereof.

The abrasive preferably comprises, consists essentially of, or consists of alumina. For example, the alumina can be seeded gel process alpha alumina, which is available from manufacturers such as Saint Gobain (alpha alumina).

The abrasive desirably is suspended in the liquid carrier (e.g., water). The abrasive typically is in particulate form. The abrasive particles can have any suitable particle size. The abrasive particles can have an average particle size of about 10 nm or more, about 20 nm or more, about 30 nm or more, about 40 nm or more, or about 50 nm or more. Alternatively, or in addition, the abrasive particles can have an average particle size of about 500 or less, about 200 nm or less, about 180 nm or less, about 170 nm or less, about 160 nm or less, about 150 nm or less, about 130 nm or less, about 110 nm or less, or about 100 nm or less. For example, the abrasive particles can have an average particle size of about 40 nm to about 130 nm, about 45 nm to about 125 nm, about 50 nm to about 120 nm, about 55 nm to about 115 nm, or about 60 nm to about 110 nm. The particle size of a particle is the diameter of the smallest sphere that encompasses the particle.

Any suitable amount of abrasive can be present in the polishing composition. The amount of abrasive in the polishing composition can be about 0.01 wt. % or more, about 0.05 wt. % or more, about 0.1 wt. % or more, about 0.2 wt. % or more, about 0.3 wt. % or more, about 0.5 wt. % or more, about 1 wt. % or more, about 5 wt. % or more, about 7 wt. % or more, about 10 wt. % or more, or about 12 wt. % or more.

Alternatively, or in addition, the amount of abrasive in the polishing composition can be about 50 wt. % or less, about 40 wt. % or less, about 15 wt. % or less, about 10 wt. % or less, about 5 wt. % or less, about 3 wt. % or less, about 1 wt. % or less, about 0.8 wt. % or less, about 0.7 wt. % or less, about 0.6 wt. % or less, or about 0.5 wt. % or less. For example, the amount of abrasive in the polishing composition can be about 0.05 wt. % to about 5 wt. %, about 0.1 wt. % to about 0.8 wt. %, or about 0.5 wt. % to about 0.7 wt. %.

A liquid carrier is used to facilitate the application of the abrasive and any optional additives to the surface of a suitable substrate to be polished (e.g., planarized). The liquid carrier can be any suitable liquid, e.g., solvent, including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

A catalyst is a substance that increases the rate of approach to equilibrium of a chemical reaction without being substantially consumed itself. Advantageously, a catalyst can be present in less than stoichiometric amounts. Without wishing to be bound by any theory, it is believed that the catalyst in conjunction with the oxidizing agent promotes the oxidation of silicon carbide to silicon dioxide.

The catalyst comprises a metal composition, wherein the metal is selected from the group consisting of transition group metals. The metal composition typically is a transition metal salt or complex having two or more oxidation states. The phrase "two or more oxidation states" refers to an atom and/or compound that has a valence number that is capable of being augmented as the result of a loss of one or more negative charges in the form of electrons.

The metal composition advantageously comprises a transition metal chosen from the group comprising Ag, Co, Cr, Cu, Fe, Mo, Mn, Nb, Ni, Os, Pd, Ru, Ir, Re Rh, Sn, Ti, V, Zr and combinations thereof. Preferably, the transition metal is Fe, Mn, Cu, Co, Ag, Pd, Pt, or Rh. More preferably, the transition metal is Pt or Co.

The metal composition typically comprises an anion or ligand in addition to the transition metal. The anion and ligand can be any suitable anion and any suitable ligand, respectively.

Suitable anions in the transition metal complexes and salts include, for example, nitrate, fluoride, chloride, chlorate, bromide, bromate, dimethylolpropionate, iodide, iodate, formate, hydrido, sulfate, phosphate, acetate, oxalate, acetylacetonate, citrate, tartrate, malonate, gluconate, phthalate, succinate, perchlorate, perbromate, periodate, and amino acid salts.

Suitable ligands in the transition metal complexes and salts depend in part on the transition metal(s) and can include, for example, olefins, functionalized olefins, cyclic olefins, ethers, pyridines, nitriles, thioethers, phosphines, amines, carbonyls, and combinations thereof. Examples of amines, include, for example, $NH_3$, $NH(CH_3)_2$, and $NH(CH_2CH_3)_2$. Examples of phosphines include, for example, $PPh_3$ and $P(CH_3)_3$.

Exemplary platinum compositions include, by way of illustration and not limitation, $Pt(acac)_2$, $PtCl_2$, $PtCl_4$, $H_2PtCl_6$, $H_2Pt(CN)_6$, $H_2PtBr_6$, $PtBr_4$, $PtF_4$ and hydrates thereof.

Exemplary cobalt compositions include, by way of illustration and not limitation, $Co(NO_3)_2$, $Co(OAc)_2$, $Co(C_2H_5O_2)_2$, $CoBr_2$, $Co(ClO_3)_2$, $Co(ClO_4)_2$, $CoCl_2$, $Co(CH_2O_2)_2$, $Co(IO_3)_2$, $CoI_2$, $Co(SO_4)_2$, and hydrates thereof.

Exemplary palladium compositions include, by way of illustration and not limitation, $Pd(acac)_2$, $Pd(OAc)_2$, $PdCl_2$, $PdBr_2$, $Pd(NO_3)_2$, and $PdSO_4$, and hydrates thereof.

Exemplary iron compositions include, by way of illustration and not limitation, $FeSO_4$, $Fe(NO_3)_2$, $FeCl_2$, $Fe(ClO_4)_3$, $FeBr_2$, $Fe(acac)_2$, $Fe(OAc)_2$, and Fe(II) oxalate, and hydrates thereof. Exemplary iron compositions include, for example, $Fe_2(SO_4)_3$, $Fe(NO_3)_3$, $FeCl_3$, $FeBr_3$, $Fe(ClO_4)_3$, $FePO_4$, $Fe(acac)_3$, and Fe(III) oxalate, and hydrates thereof.

Exemplary manganese compositions include, by way of illustration and not limitation, $Mn(OAc)_2$, $Mn(ClO_4)_2$, $MnBr_2$, $MnCl_2$, $Mn(NO_3)_2$, and $MnSO_4$, and hydrates thereof. Exemplary manganese compositions include, for example, $Mn(OAc)_3$ and $Mn(acac)_3$, and hydrates thereof.

Exemplary copper compositions include, by way of illustration and not limitation, CuOAc, CuBr, CuCl, and CuI, and hydrates thereof. Exemplary copper compositions include, for example, $Cu(OAc)_2$, $CuBr_2$, $CuCl_2$ and $Cu(ClO_4)_2$, and hydrates thereof.

Exemplary silver compositions include, by way of illustration and not limitation, AgOAc, Ag citrate, $AgNO_3$, $AgBrO_3$, AgBr, $AgClO_4$, AgCl, AgI, and $Ag_2SO_4$, and hydrates thereof.

Exemplary iridium compositions include, by way of illustration and not limitation, $Ir(acac)_3$, $IrCl_3$, and $IrBr_3$, and hydrates thereof.

Exemplary rhodium compositions, by way of illustration and not limitation, $Rh(acac)_3$, $RhCl_3$, $RhBr_3$, $Rh(NO_3)_3$, $RhPO_4$, and $Rh_2(SO_4)_3$, and hydrates thereof.

Exemplary nickel compositions include, by way of illustration and not limitation, $Ni(acac)_2$, $NiCl_2$, $NiBr_2$, and $Ni(NO_3)_2$, $NiSO_4$, and Ni(II) oxalate, and hydrates thereof.

The catalyst can be homogeneous or heterogenous. The metal composition is advantageously at least partially soluble in the liquid carrier under the conditions under which the polishing is carried out, or are carried by, absorbed onto, or attached to an inert support such as, for example, silica or alumina. By "at least partially soluble" is meant that the metal composition has a solubility in the liquid carrier of at least 1 μg/mL or more, i.e., at least 1 μg of metal composition dissolves completely in 1 mL of liquid carrier.

The catalyst comprising a metal composition can be present in the polishing composition in any suitable amount. The polishing composition can comprise about 5 ppm or more, 50 ppm or more, 100 ppm or more, about 250 ppm or more, about 500 ppm or more, about 1000 ppm or more, about 1500 ppm or more, about 2000 ppm or more, about 2500 ppm or more, or about 3000 ppm or more catalyst. Alternatively, or in addition, the polishing composition can comprise about 10000 ppm or less, about 8000 ppm or less, about 7000 ppm or less, about 6000 ppm or less, about 5000 ppm or less, about 4000 ppm or less, or about 3000 ppm or less catalyst. For example, the polishing composition can comprise about 5 ppm to about 5000 ppm, about 100 ppm to about 1000 ppm, about 50 ppm to about 5000 ppm, about 1000 ppm to about 5000 ppm, about 3000 ppm to about 5000 ppm, or about 3000 ppm to about 4000 ppm catalyst.

The polishing composition employs an oxidizing agent in conjunction with a catalyst. The oxidizing agent can be any suitable oxidizing agent that oxidizes silicon carbide. Preferably, the oxidizing agent is selected from the group consisting of hydrogen peroxide, oxone, ammonium cerium nitrate, periodates, iodates, persulfates, chlorates, chromates, permanganates, bromates, perbromates, ferrates, perrhenates, perruthenates, and mixtures thereof. The permanganates, periodiates, and persulfates can be any periodate, iodate, persulfate or combination of periodates, iodates, and persulfates, such as, for example, potassium periodate, periodic acid, ammonium persulfate, potassium persulfate, or potassium permanganate. More preferably, the oxidizing agent is potassium persulfate, potassium permanganate, or periodic acid.

The oxidizing agent can be present in the polishing composition in any suitable amount. The polishing composition can comprise about 0.001 wt. % or more, about 0.005 wt. % or more, about 0.01 wt. % or more, about 0.05 wt. % or more, about 0.1 wt. % or more, or about 0.2 wt. % or more oxidizing agent. Alternatively, or in addition, the polishing composition can comprise about 20 wt. % or less, about 15 wt. % or less, about 10 wt. % or less, about 5 wt. % or less, about 2 wt. % or less, about 1 wt. % or less, or about 0.5 wt. % or less oxidizing agent. For example, the polishing composition can comprise about 0.01 wt. % to about 5 wt. %, about 0.05 wt. % to about 1 wt. %, about 0.1 wt. % to about 0.5 wt. %, or about 0.2 wt. % to about 0.5 wt. % oxidizing agent.

The polishing composition, specifically the liquid carrier with any components dissolved or suspended therein, can have any suitable pH. The actual pH of the polishing composition will depend, in part, on the type of substrate being polished. The polishing composition can have a pH of about 11 or less, about 9 or less, about 7 or less, about 6 or less, about 5 or less, about 4 or less, about 3 or less, or about 2 or less. Alternatively, or in addition, the polishing composition can have a pH of about 1 or more, about 2 or more, about 3 or more, about 4 or more, about 6 or more, about 8 or more, or about 9 or more. For example, the pH can be from about 1 to about 11, from about 2 to about 10, from about 2 to about 6, from about 3 to about 9, from about 4 to about 8, from about 5 to about 7, or from about 3 to about 5.

The pH of the polishing composition can be achieved and/or maintained by any suitable means. More specifically, the polishing composition can further comprise a pH adjustor, a pH buffering agent, or a combination thereof. The pH adjustor can comprise, consist essentially of, or consist of any suitable pH-adjusting compound. For example, the pH adjustor can be any suitable acid, such as an inorganic or an organic acid, or combination thereof. For example, the acid can be nitric acid. The pH buffering agent can be any suitable buffering agent, for example, phosphates, acetates, borates, sulfonates, carboxylates, and the like. The polishing composition can comprise any suitable amount of a pH adjustor and/or a pH buffering agent, provided such amount is sufficient to achieve and/or maintain the desired pH of the polishing composition, e.g., within the ranges set forth herein.

It will be appreciated that many of the aforementioned compounds can exist in the form of a salt, an acid, or as a partial salt. Furthermore, certain compounds or reagents may perform more than one function. For example, some compounds can function both as a chelating agent and an oxidizing agent.

The polishing composition can comprise a surfactant and/or rheological control agent, including viscosity enhancing agents and coagulants (e.g., polymeric rheological control agents, such as, for example, urethane polymers). Suitable surfactants can include, for example, cationic surfactants, anionic surfactants, nonionic surfactants, amphoteric surfactants, mixtures thereof, and the like. The amount of surfactant in the polishing composition typically is about 0.0001 wt. % to about 1 wt. % (preferably about 0.001 wt. % to about 0.1 wt. % and more preferably about 0.005 wt. % to about 0.05 wt. %).

The polishing composition can comprise an antifoaming agent. The antifoaming agent can be any suitable anti-foaming agent. Suitable antifoaming agents include, but are not limited to, silicon-based and acetylenic diol-based antifoaming agents. The amount of anti-foaming agent in the polishing composition typically is about 10 ppm to about 140 ppm.

The polishing composition can comprise a biocide. The biocide can be any suitable biocide, for example, an isothiazolinone biocide. The amount of biocide in the polishing composition typically is about 1 to about 500 ppm, preferably about 2 to about 20 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., oxidizing agent, abrasive, etc.) as well as any combination of ingredients (e.g., water, catalyst, surfactant, etc.).

The polishing composition can be supplied as a one-package system comprising the liquid carrier, the abrasive, the oxidizing agent, and optionally other additives. Alternatively, some of the components, such as an oxidizing agent, can be supplied in a first container, either in dry form, or as a solution or dispersion in the liquid carrier, and the remaining components, such as the abrasive and other additives, can be supplied in a second container or multiple other containers. Other two-container, or three- or more container combinations of the components of the polishing composition are within the knowledge of one of ordinary skill in the art.

Solid components, such as the abrasive, can be placed in one or more containers either in dry form or as a solution in the liquid carrier. Moreover, it is suitable for the components in the first, second, or other containers to have different pH values, or alternatively to have substantially similar, or even equal, pH values. The components of the polishing composition can be partially or entirely supplied separately from each other and can be combined, e.g., by the end-user, shortly before use (e.g., 1 week or less prior to use, 1 day or less prior to use, 1 hour or less prior to use, 10 minutes or less prior to use, or 1 minute or less prior to use).

The polishing composition also can be provided as a concentrate which is intended to be diluted with an appropriate amount of liquid carrier prior to use. In such an embodiment, the polishing composition concentrate can comprise a liquid carrier and optionally other components in amounts such that, upon dilution of the concentrate with an appropriate amount of liquid carrier, each component will be present in the polishing composition in an amount within the appropriate range recited above for each component. For example, each component can be present in the concentrate in an amount that is about 2 times (e.g., about 3 times, about 4 times, about 5 times, or at least about 10 times) greater than the concentration recited above for each component in the polishing composition so that, when the concentrate is diluted with an appropriate volume of liquid carrier (e.g., an equal volume of liquid carrier, 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the other components of the polishing composition are at least partially or fully dissolved or suspended in the concentrate.

The inventive method of polishing a substrate is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition (which generally is disposed between the substrate and the polishing pad), with the polishing pad moving relative to the substrate, so as to abrade at least a portion of the substrate to polish the substrate.

Desirably, the polishing end-point is determined by monitoring the weight of the silicon carbide substrate, which is used to compute the amount of silicon carbide removed from the substrate. Polishing end-point determination techniques are well known in the art.

Polishing refers to the removal of at least a portion of a surface to polish the surface. Polishing can be performed to provide a surface having reduced surface roughness by removing gouges, crates, pits, and the like (i.e., to planarize the surface), but polishing also can be performed to introduce or restore a surface geometry characterized by an intersection of planar segments.

The method of the invention can be used to polish any suitable substrate comprising at least one layer of silicon carbide. The silicon carbide can be removed at any suitable rate to effect polishing of the substrate. For example, silicon carbide can be removed at a rate of about 50 nm/hr or more, about 70 nm/hr or more, about 100 nm/hr or more, about 200 nm/hr or more, about 500 nm/hr or more, about 1000 nm/hr or more, or about 2000 nm/hr or more.

EXAMPLE 1

This example demonstrates the effect on the removal rate of silicon carbide by the presence of different transition metal compositions in the polishing composition of the invention.

An on-axis 4HPSI single crystal silicon carbide wafer was polished with 11 different polishing compositions. Each of the polishing compositions contained water, 0.6 wt. % seeded gel process alpha alumina, a catalyst as indicated below, and 0.3 wt. % of potassium persulfate (KPS), and was adjusted to a pH of 4.

The silicon carbide removal rate (nm/hr) was determined for each polishing composition, and the results are shown in Table 1.

TABLE 1

| Polishing Composition | Catalyst | Catalyst Concentration | Silicon Carbide Removal Rate (nm/hr) |
|---|---|---|---|
| 1A (invention) | $FeSO_4 \cdot 7H_2O$ | 3085 ppm | <20 |
| 1B (invention) | $Fe(NO_3)_3 \cdot 9H_2O$ | 4485 ppm | 140 |
| 1C (invention) | $Mn(ClO_4)_2 \cdot 6H_2O$ | 4017 ppm | 170 |
| 1D (invention) | CuBr | 1591 ppm | 130 |
| 1E (invention) | $Co(NO_3)_2 \cdot 6H_2O$ | 3230 ppm | 275 |
| 1F (invention) | $AgNO_3$ | 1885 ppm | 215 |
| 1G (invention) | $IrCl_3$ | 3313 ppm | 95 |
| 1H (invention) | $PdCl_2$ | 1702 ppm | 210 |
| 1I (invention) | $H_2PtCl_6$ | 4550 ppm | 705 |
| 1J (invention) | $Rh_2(PO_4)_3$ | 599 ppm | 110 |
| 1K (invention) | $NiBr_2$ | 2450 ppm | 80 |

As is apparent from the data presented in Table 1, the inventive polishing compositions with a variety of catalysts resulted in a significant silicon carbide removal rate.

EXAMPLE 2

This example demonstrates the effect on the removal rate of silicon carbide by the presence of different types of oxidizing agents in combination with a catalyst in a polishing composition.

An on-axis 4HPSI single crystal silicon carbide wafer was polished with 9 different polishing compositions. Each of the polishing compositions contained water, 0.6 wt. % seeded gel process alpha alumina, and an oxidizing agent as indicated below, and was adjusted to a pH of 4. Polishing Compositions 2A-2C did not contain an catalyst, while Polishing Compositions 2D-2F contained 0.15 wt. % $H_2PtCl_6$, and Polishing Compositions 2G-2I contained 0.27 wt. % $Co(NO_3)_2 \cdot 6H_2O$.

The silicon carbide removal rate (nm/hr) was determined for each polishing composition, and the results are shown in Table 2.

TABLE 2

| Polishing Composition | Catalyst | Catalyst Concentration (wt. %) | Oxidizing Agent | Oxidizing Agent Concentration (wt. %) | Silicon Carbide Removal Rate (nm/hr) |
|---|---|---|---|---|---|
| 2A (comparative) | None | — | KPS | 0.3 | 248 |
| 2B (comparative) | None | — | $H_5IO_6$ | 0.25 | 656 |
| 2C (comparative) | None | — | $KMnO_4$ | 0.14 | 1722 |
| 2D (invention) | $H_2PtCl_6$ | 0.15 | KPS | 0.3 | 644 |
| 2E (invention) | $H_2PtCl_6$ | 0.15 | $H_5IO_6$ | 0.25 | 1528 |
| 2F (invention) | $H_2PtCl_6$ | 0.15 | $KMnO_4$ | 0.14 | 2367 |
| 2G (invention) | $Co(NO_3)_2 \cdot 6H_2O$ | 0.27 | KPS | 0.3 | 352 |
| 2H (invention) | $Co(NO_3)_2 \cdot 6H_2O$ | 0.27 | $H_5IO_6$ | 0.25 | 929 |
| 2I (invention) | $Co(NO_3)_2 \cdot 6H_2O$ | 0.27 | $KMnO_4$ | 0.14 | 950 |

As is apparent from the data presented in Table 2, polishing compositions comprising a catalyst in combination with an oxidizing agent resulted in a significant silicon carbide removal rate as compared to similar polishing compositions that did not contain a catalyst.

EXAMPLE 3

This example demonstrates the effect on the removal rate of silicon carbide by the concentration of the catalyst in the polishing composition.

A 4HPSI single crystal silicon carbide wafer was polished with 5 different polishing compositions. Each of the polishing compositions contained water, 0.6 wt. % seeded gel process alpha alumina, chloroplatinic acid ($H_2PtCl_6$) in the amount indicated below, and 0.3 wt. % KPS, and was adjusted to a pH of 4.

The silicon carbide removal rate (nm/hr) was determined for each polishing composition, and the results are shown in Table 3.

TABLE 3

| Polishing Composition | $H_2PtCl_6$ Concentration (ppm) | Silicon Carbide Removal Rate (nm/hr) |
| --- | --- | --- |
| 3A (comparative) | 0 | 260 |
| 3B (invention) | 100 | 380 |
| 3C (invention) | 300 | 650 |
| 3D (invention) | 800 | 730 |
| 3E (invention) | 1700 | 800 |

As is apparent from the data presented in Table 3, polishing compositions comprising the catalyst, chloroplatinic acid, over a concentration range of 100 ppm to 1700 ppm resulted in a significant silicon carbide removal rate, which was greater than the silicon carbide removal rate achieved with a similar polishing composition that did not contain a catalyst.

EXAMPLE 4

This example demonstrates the effect on the removal rate of silicon carbide by the presence of different types of ligands in a polishing composition containing the catalyst $Co(NO_3)_2 \cdot 6H_2O$.

A 4HPSI single crystal silicon carbide wafer was polished with 3 different polishing compositions. Each of the polishing compositions contained water, 0.6 wt. % seeded gel process alpha alumina, 3230 ppm $Co(NO_3)_2 \cdot 6H_2O$, and 0.3 wt. % KPS, and was adjusted to a pH of 4. The polishing composition contained three different amine ligands as indicated below.

The silicon carbide removal rate (nmihr) was determined for each polishing composition, and the results are shown in Table 4.

TABLE 4

| Polishing Composition | Ligand | Ligand Concentration (ppm) | Silicon Carbide Removal Rate (nm/hr) |
| --- | --- | --- | --- |
| 4A (invention) | $NH_3$ | 943 | 300 |
| 4B (invention) | $NH(CH_3)_2$ | 3230 | 205 |
| 4C (invention) | $NH(CH_2CH_3)_2$ | 3230 | 220 |

As is apparent from the data presented in Table 4, the use of a ligand in combination with the catalyst in the inventive polishing composition resulted in a significant silicon carbide removal rate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate comprising:
   (i) providing a substrate comprising at least one layer of single crystal silicon carbide,
   (ii) contacting the substrate with a chemical-mechanical polishing composition comprising:
      (a) a liquid carrier,
      (b) an abrasive,
      (c) a catalyst comprising a metal composition, wherein the metal is Co or Pt, and
      (d) an oxidizing agent that oxidizes silicon carbide,
   (iii) moving the polishing composition relative to the substrate, and
   (iv) abrading at least a portion of the silicon carbide of the substrate to polish the substrate.

2. The method of claim 1, wherein the oxidizing agent is selected from the group consisting of persulfates, organic peroxides, inorganic peroxides, peroxyacids, permanganates, chromates, percarbonates, chlorates, bromates, iodates, perchloric acid and salts thereof, perbromic acid and salts thereof, periodic acid and salts thereof, hydroxylamine and salts thereof, ferricyanide, oxone, and combinations thereof.

3. The method of claim 2, wherein the oxidizing agent is periodic acid, ammonium persulfate, potassium persulfate, or potassium permanganate.

4. The method of claim 1, wherein the oxidizing agent is present in an amount of about 0.001 wt. % to about 5 wt. % based on the weight of the liquid carrier and any components dissolved or suspended therein.

5. The method of claim 1, wherein the abrasive is selected from the group consisting of silica, alumina, titania, zirconia, ceria, magnesia, and combinations thereof.

6. The method of claim 5, wherein the abrasive is alumina.

7. The method of claim 1, wherein the abrasive is present in an amount of about 0.05 wt. % to about 5 wt. % based on the weight of the liquid carrier and any components dissolved or suspended therein.

8. The method of claim 7, wherein the abrasive is present in an amount of about 0.1 wt. % to about 0.8 wt. % based on the weight of the liquid carrier and any components dissolved or suspended therein.

9. The method of claim 1, wherein the metal composition comprises a ligand selected from the group consisting of nitrate, fluoride, chloride, chlorate, dimethylolpropionate, formate, bromide, bromate, iodide, iodate, hydrido, sulfate, phosphate, acetate, oxalate, acetylacetonate, citrate, tartrate, malonate, gluconate, phthalate, succinate, perchlorate, perbromate, and periodate.

10. The method of claim 1, wherein the metal composition is $Co(NO_3)_2 \cdot 6H_2O$.

11. The method of claim 1, wherein the metal composition is $H_2PtCl_6$.

12. The method of claim 1, wherein the catalyst is present in an amount of about 5 ppm to about 5000 ppm.

13. The method of claim 12, wherein the catalyst is present in an amount of about 3000 ppm to about 4000 ppm.

14. The method of claim 1, wherein the liquid carrier is water.

15. The method of claim 1, wherein the abrasive is alumina, and the oxidizing agent is potassium persulfate or ammonium persulfate.

16. The method of claim 1, wherein the abrasive is alumina, and the oxidizing agent is a permanganate or a periodate.

17. The method of claim 15, wherein the alumina is present in an amount of about 0.5 wt. % to about 0.7 wt. % based on the weight of the liquid carrier and any components dissolved or suspended therein.

18. The method of claim 16, wherein the alumina is present in an amount of about 0.5 wt. % to about 0.7 wt. % based on the weight of the liquid carrier and any components dissolved or suspended therein.

19. The method of claim 15, wherein the persulfate is present in an amount of about 0.2 wt. % to about 0.5 wt. %, and the catalyst is present in an amount of about 3000 ppm to about 5000 ppm.

20. The method of claim 16, wherein the oxidizing agent is a periodate and is present in an amount of about 0.2 wt. % to about 0.5 wt. %, and the catalyst is cobalt and is present in an amount of about 3000 ppm to about 5000 ppm.

21. The method of claim 1, wherein the oxidizing agent is a persulfate, permanganate, or periodate and is present in an amount of about 0.1 wt. % to about 0.5 wt. %, and the catalyst is platinum and is present in an amount of about 100 ppm to about 1000 ppm.

* * * * *